(12) United States Patent
Muramatsu et al.

(10) Patent No.: US 6,998,291 B2
(45) Date of Patent: Feb. 14, 2006

(54) COST-REDUCING AND PROCESS-SIMPLIFYING WIRING BOARD AND MANUFACTURING METHOD THEREOF

(75) Inventors: Shigetsugu Muramatsu, Nagano (JP); Tohru Hizume, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 0 days.

(21) Appl. No.: 10/859,639

(22) Filed: Jun. 3, 2004

(65) Prior Publication Data

US 2004/0266060 A1    Dec. 30, 2004

(30) Foreign Application Priority Data

Jun. 30, 2003    (JP)    ............................. 2003-187855

(51) Int. Cl.
  *H01L 21/44*    (2006.01)
(52) U.S. Cl. ...................................... 438/106; 257/692

(58) Field of Classification Search ................ 257/692, 257/698, 780, 781, 784–786, 774; 438/15, 438/26, 106, 118
See application file for complete search history.

(56) References Cited

U.S. PATENT DOCUMENTS 6,054,761 A * 4/2000 McCormack et al. ........ 257/698
2002/0066672 A1   6/2002 Iijima et al.

FOREIGN PATENT DOCUMENTS

JP      2002-171048      6/2002

* cited by examiner

*Primary Examiner*—David Vu
(74) *Attorney, Agent, or Firm*—Ladas & Parry LLP

(57) ABSTRACT

A wiring board is disclosed that includes a first insulating layer, a conductor which is formed on a surface of the first insulating layer, and a second insulating layer which is formed on surfaces of the first insulating layer and of the conductor. The wiring board is provided with a semispherical-shaped or conical-shaped hole-forming portion which penetrates through the second insulating layer into the conductor.

3 Claims, 16 Drawing Sheets

COST-REDUCING AND PROCESS-SIMPLIFYING WIRING BOARD AND MANUFACTURING METHOD THEREOF

BACKGROUND OF THE INVENTION

1. Field of the Invention

The present invention generally relates to a wiring board, and particularly relates to a wiring board having formed thereon a via for electrically connecting among layers, and a manufacturing method thereof.

2. Description of the Related Art

As a method of manufacturing a wiring board on which semiconductor devices and the like are mounted, there is a so-called build-up process. FIG. 1 through FIG. 7 illustrate cross-sectional views of manufacturing processes of a wiring board according to the related-art build-up process. In a first manufacturing process illustrated in FIG. 1, a conducting layer 520 is formed on the top face of a substrate 510, and also a conducting layer 530 is similarly formed on the bottom face of the substrate 510. In a second manufacturing process illustrated in FIG. 2, a through hole 540 which penetrates the substrate 510 as well as the conducting layers 520 and 530 is formed. In a third manufacturing process illustrated in FIG. 3, a conducting layer 550 is formed by a plating process on the surfaces of the substrate 510 (including the inner-wall faces of the through hole 540) and on the surfaces of the conducting layers 520 and 530. Next, in a fourth manufacturing process illustrated in FIG. 4, by an etching process and the like, the conducting layers 520 and 550 are patterned so as to have wiring patterns 560 and 555 formed, while the conducting layers 530 and 550 are patterned so as to have wiring patterns 570 and 555 formed. Thereafter, in a fifth manufacturing process illustrated in FIG. 5, an insulating resin layer 580 is formed on the top face of the substrate 510. Furthermore, an insulating resin layer may similarly be formed also on the bottom face of the substrate 510. In a sixth manufacturing process illustrated in FIG. 6, within the insulating resin layer 580, an opening section 590 is formed at a via-forming region by a laser-beam machining process so as to cause the wiring patterns 560 and 555 to be exposed. Furthermore, in a seventh manufacturing process illustrated in FIG. 7, a conducting film 600 is formed by the plating process on inner-wall faces of the opening section 590, while a via 610 for electrically connecting between the layers is formed by the conducting film 600 and the wiring patterns 560 and 555 which have been exposed to the opening section 590. Moreover, a wiring pattern 620 is formed on the top face of the insulating resin layer 580.

With the manufacturing method of the wiring board as described above, while the opening section 590 is formed by the laser-beam machining process, in the laser-beam machining process, appropriately controlling the strength of the laser beam and the time of irradiating the laser beam is not easy, resulting in an increasing of the cost of manufacturing. Therefore, a method of forming the opening section 590 by an imprint process in which a die having a projecting section formed thereon is thrust is being proposed (e.g. referring to page 5 and FIG. 5 of the Patent Document 1).

FIG. 8 and FIG. 9 are enlarged cross-sectional views of manufacturing processes in which the opening section 590 is formed by the press process using the die. In a first manufacturing process illustrated in FIG. 8, a die 700 is arranged over the top face of the interlayer resin layer 580. A convex section 710 is formed on one face of the die 700, and is arranged so that the face on which the convex section 710 is formed opposes the interlayer resin layer 580. Furthermore, in a second manufacturing process illustrated in FIG. 9, the interlayer resin layer 580 is thrust by the die 700 so that the opening section 590 is formed.

Patent Document 1
JP2002-171048A

However, in the process of forming the opening section 590 by the press process using the die 700 as described above, in a case that the tip of the convex section 710 formed on the die 700 is flat-shaped, as illustrated in FIG. 9, resin 720 may remain at the bottom portion of the opening section 590. In the seventh process as illustrated in FIG. 7, at the time the conducting film 600 is formed by the plating process, as the remaining resin 720 prevents an electrical connection between the conducting film 600 and the wiring patterns 560 and 555, a need arises for removing the remaining resin 720 by the etching process and the like. Therefore, a further simplification of the process is being called for.

SUMMARY OF THE INVENTION

It is a general object of the present invention to provide a wiring board and a manufacturing process thereof that substantially obviate one or more problems caused by the limitations and disadvantages of the related art.

In light of the problems as described above, it is a more particular object of the present invention to provide a wiring board and a manufacturing process which enable a reducing of the cost of manufacturing as well as a simplifying of the manufacturing process.

According to the invention, a wiring board includes a first insulating layer, a conductor which is formed on a surface of the first insulating layer, and a second insulating layer which is formed on surfaces of the first insulating layer and of the conductor, wherein the wiring board is provided with a semispherical-shaped or conical-shaped hole-forming portion which penetrates through the second insulating layer into the conductor.

The wiring board in an embodiment of the invention enables a reducing of the cost of manufacturing as well as a simplifying of the manufacturing process.

According to the invention, a method of manufacturing a wiring board includes the steps of forming a conductor on a surface of a first insulating layer, forming a second insulating layer on surfaces of the first insulating layer and the conductor, and forming, by a press process which thrusts into the second insulating layer a die with its tip portion having a semispherical-shaped or a conical-shaped convex section, in the second insulating layer, a semispherical-shaped or conical-shaped opening section which causes a portion of the conductor to be exposed.

The method of manufacturing the wiring board in an embodiment of the invention enables a reducing of the cost of manufacturing as well as a simplifying of the manufacturing process.

Other objects and further features of the present invention will become apparent from the following detailed description when read in conjunction with the accompanying drawings.

DETAILED DESCRIPTION OF THE PREFERRED EMBODIMENTS

In the following, embodiments of the present invention are described with reference to the accompanying drawings.

Figure 1:
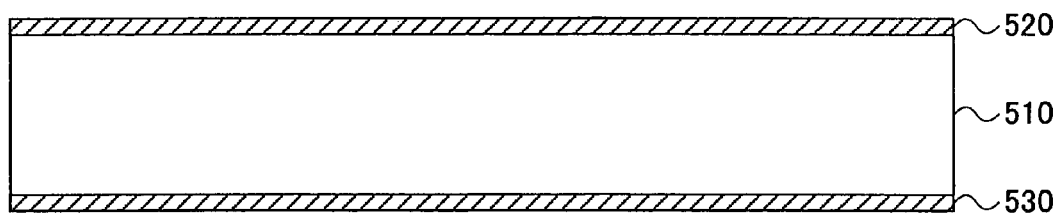
FIG. 1 is a cross-sectional view of a first manufacturing process of a wiring board according to the related art.
Figure 2:
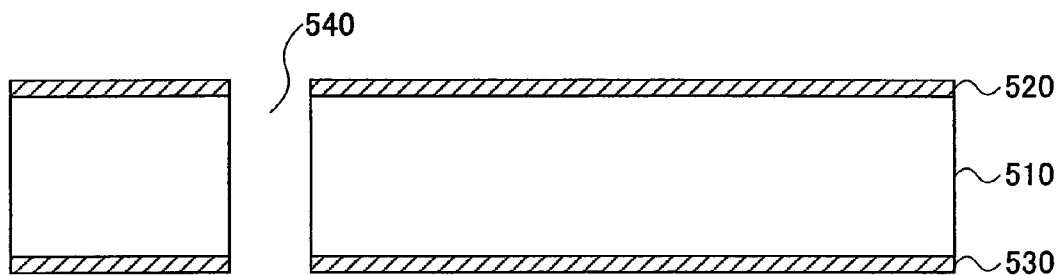
FIG. 2 is a cross-sectional view of a second manufacturing process of the wiring board according to the related art.
Figure 3:
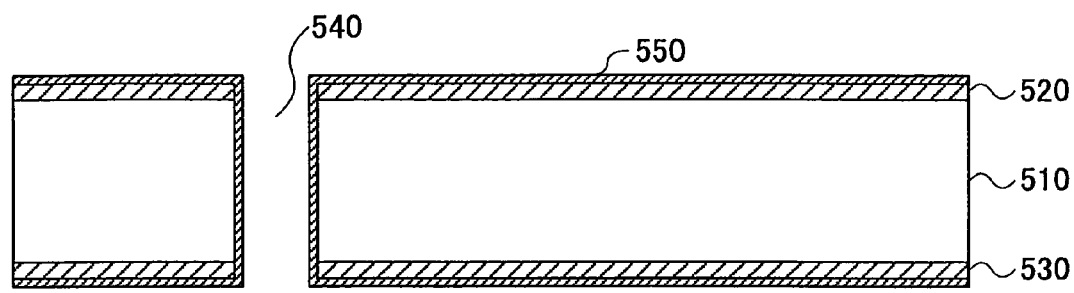
FIG. 3 is a cross-sectional view of a third manufacturing process of the wiring board according to the related art.
Figure 4:
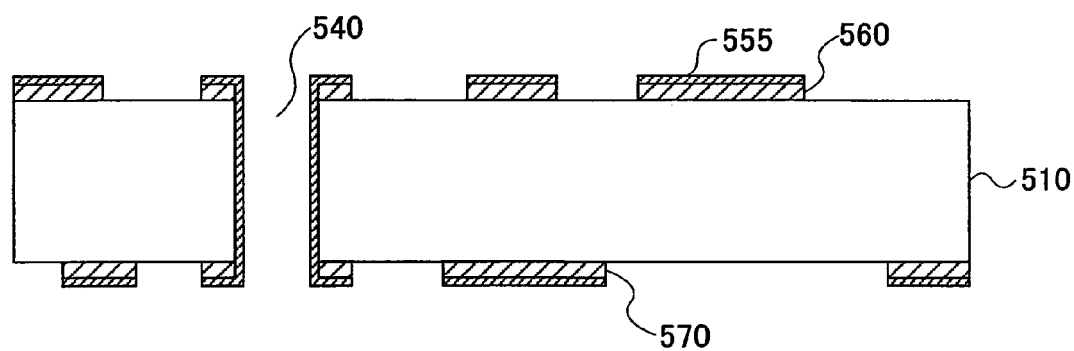
FIG. 4 is a cross-sectional view of a fourth manufacturing process of the wiring board according to the related art.
Figure 5:
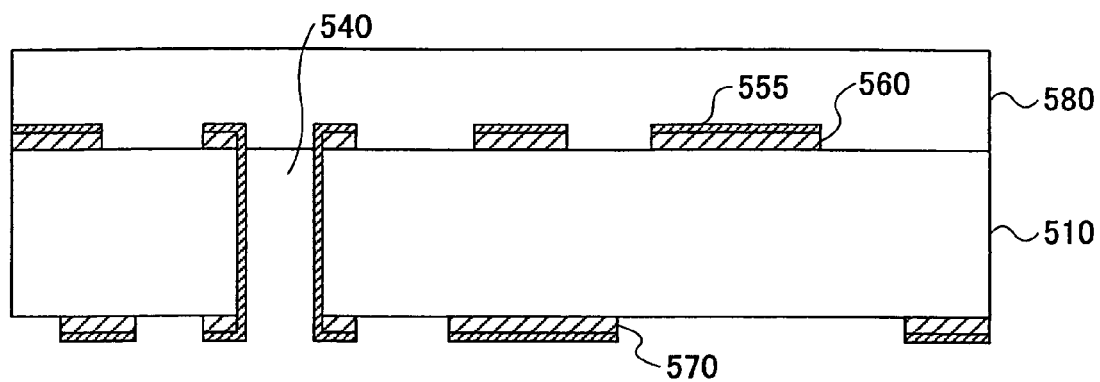
FIG. 5 is a cross-sectional view of a fifth manufacturing process of the wiring board according to the related art.
Figure 6:
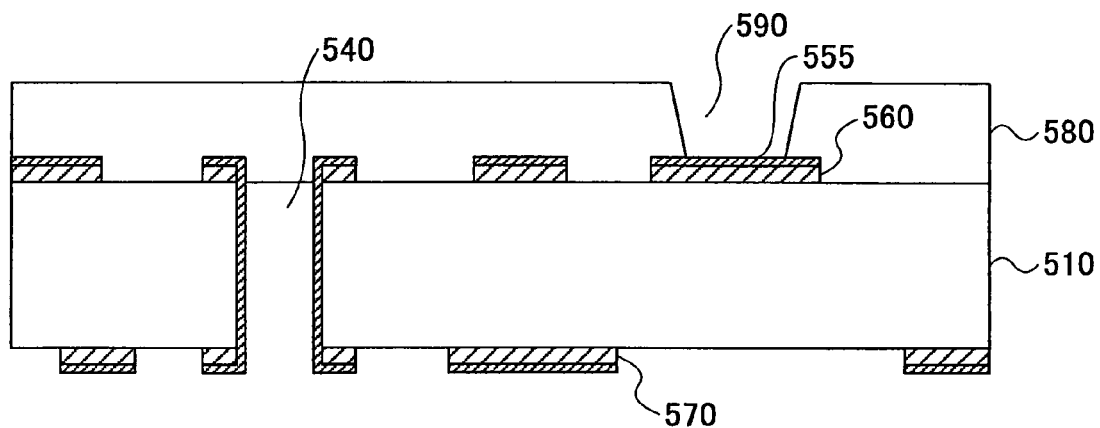
FIG. 6 is a cross-sectional view of a sixth manufacturing process of the wiring board according to the related art.
Figure 7:
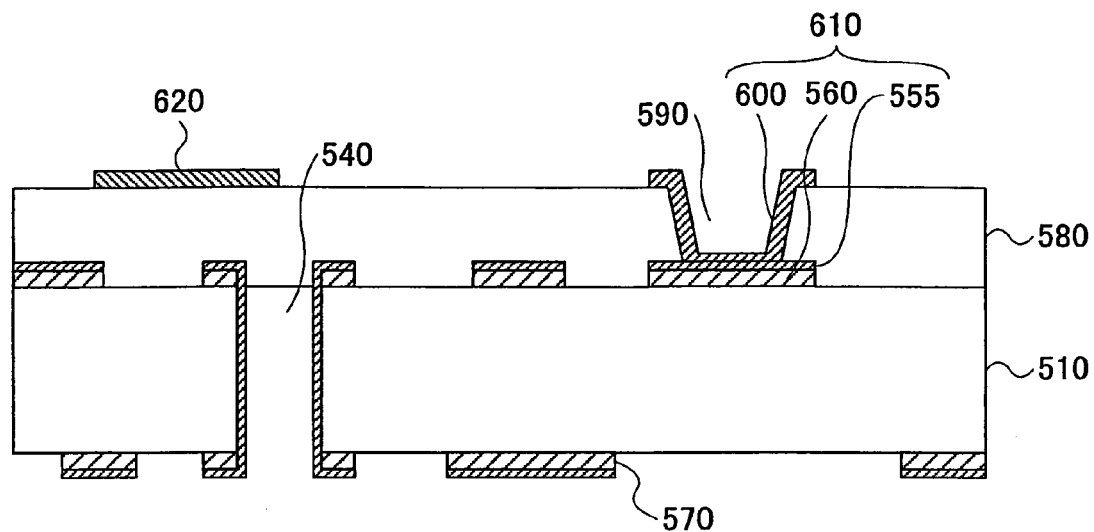
FIG. 7 is a cross-sectional view of a seventh manufacturing process of the wiring board according to the related art.
Figure 8:
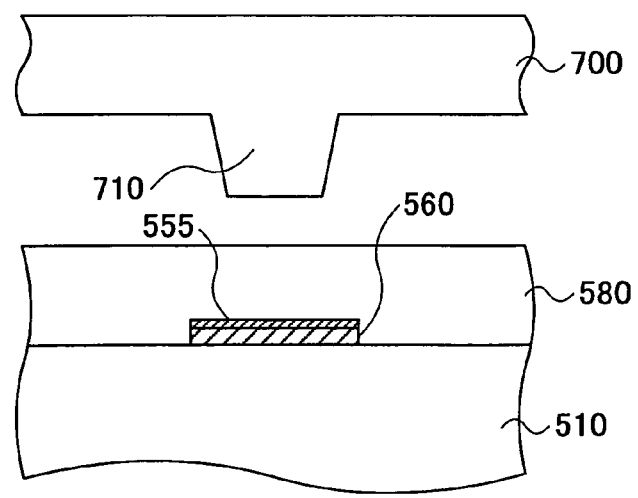
FIG. 8 is an enlarged cross-sectional view of a first manufacturing process of forming an opening section by a press process using a die according to the related art.
Figure 9:
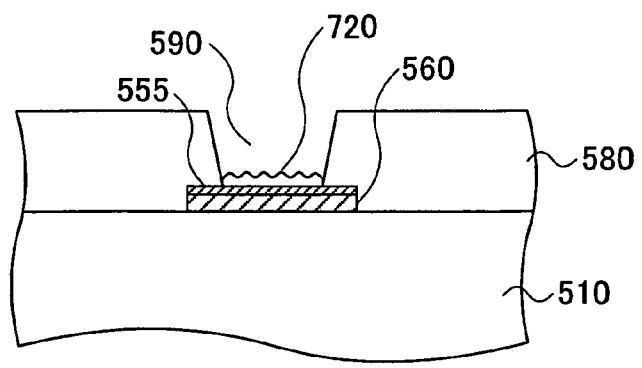
FIG. 9 is an enlarged cross-sectional view of a second manufacturing process of forming the opening section by the press process using the die according to the related art.
Figure 10:
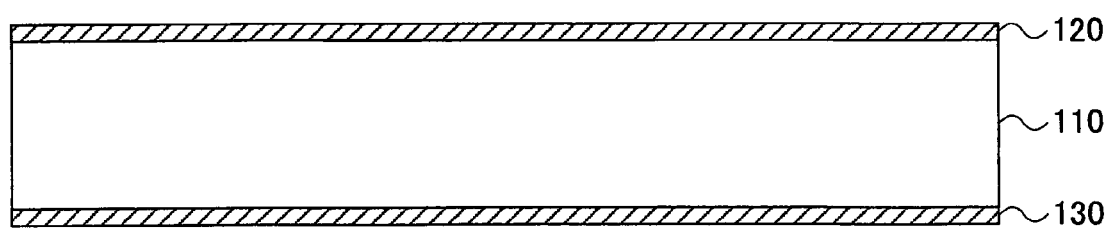
FIG. 10 is a cross-sectional view of a first manufacturing process of the wiring board according to embodiments of the present invention.
Figure 11:
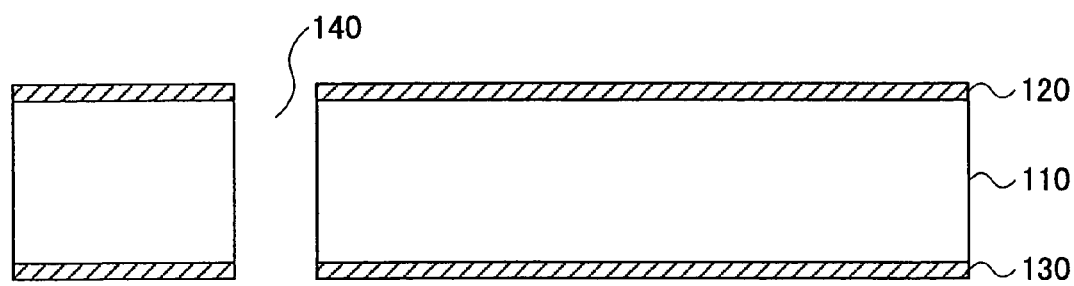
FIG. 11 is a cross-sectional view of a second manufacturing process of the wiring board according to the present embodiments.
Figure 12:
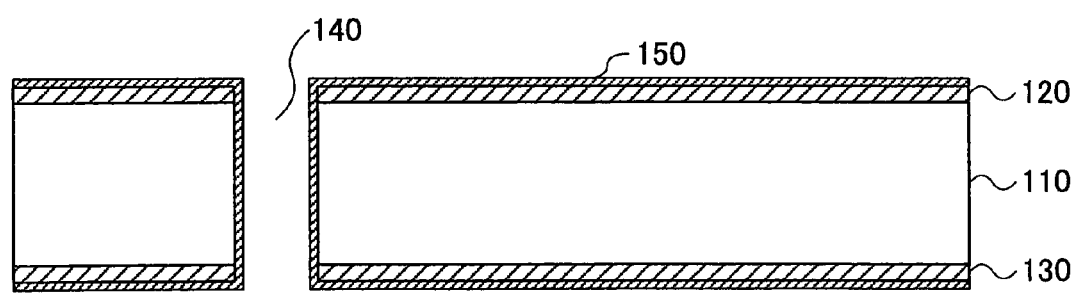
FIG. 12 is a cross-sectional view of a third manufacturing process of the wiring board according to the present embodiments.

FIG. 10 is a cross-sectional view of a first manufacturing process of the wiring board according to the present embodiment. In the first manufacturing process as illustrated in FIG. 10, a conducting layer 120 is formed on the top face of a substrate 110 as a first insulating layer, and similarly a conducting layer 130 is formed on the bottom face of the substrate 110. The substrate 110 may be, for example, resin board such as a glass-reinforced epoxy board and the like, while the conducting layers 120 and 130 may be, for example, copper foil. FIG. 11 is a cross-sectional view of a second manufacturing process according to the present embodiment. In the second manufacturing process illustrated in FIG. 11, a through hole 140 which penetrates the substrate 110 and the conducting layers 120 and 130 is formed by a drill and the like. FIG. 12 is a cross-sectional view of a third manufacturing process of the wiring board according to the present embodiment. In the third manufacturing process in FIG. 12, a conducting layer 150 is formed on the faces (including the inner-wall faces of the through hole 140) of the substrate 110, and on the surfaces of the conducting layers 120 and 130. This conducting layer 150 is formed, for example, after a metal thin-film (no figures) is formed on the faces of the substrate 110 and on the surfaces of the conducting layer 120 and 130 by such electroless plating as copper plating and the like, by having further electroplating performed with the metal thin-film as a feeding layer. Having the conducting layer 150 formed on the inner-wall faces of the through hole 140 causes the conducting layer 120 having been formed on the top face of the substrate 110 and the conducting layer 130 having been formed on the bottom face of the conducting layer 110 to be electrically connected.

Figure 13:
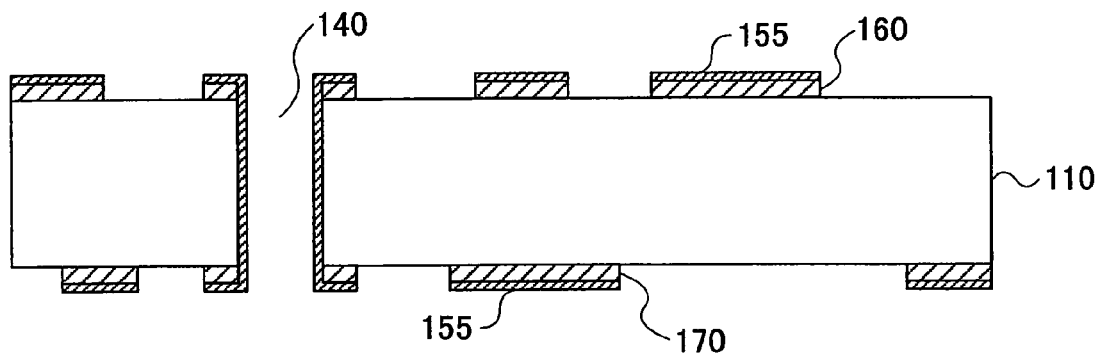
FIG. 13 is a cross-sectional view of a fourth manufacturing process of the wiring board according to the present embodiments.

FIG. 13 is a cross-sectional view of a fourth manufacturing process of the wiring board according to the present embodiment. In the fourth manufacturing process in FIG. 13, the conducting layers 120 and 150 are patterned so as to cause the wiring patterns 160 and 155, respectively, as the conductors to be formed, while the conducting layers 130 and 150 are patterned so as to cause the wiring patterns 170 and 155, respectively, as the conductors to be formed. More specifically, after a photo-resist is applied on the surface of the conducting layer 150, in accordance with the shapes of the wiring patterns 160 and 155, the photo-resist is exposed and developed so as to cause a resist pattern to be formed. Furthermore, having the exposing part of the conducting layer 155, and the conducting layer 120 at the lower part thereof removed by etching with the resist pattern as described above as a mask, causes the wiring patterns 160 and 155 to be formed. The wiring patterns 170 and 155 are caused to be formed in a similar manner as the wiring patterns 160 and 155.

Figure 14:
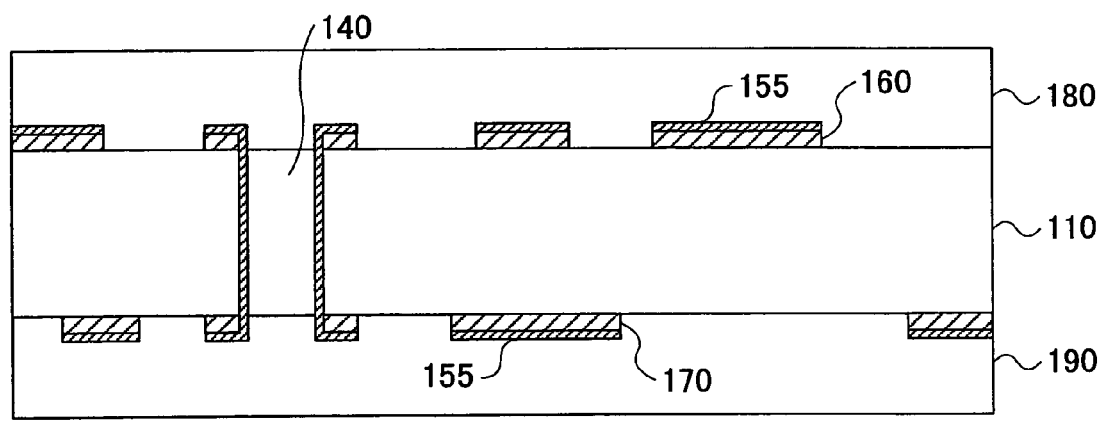
FIG. 14 is a cross-sectional view of a fifth manufacturing process of the wiring board according to the present embodiments.

FIG. 14 is a cross-sectional view of a fifth manufacturing process according to the present embodiment. In the fifth manufacturing process in FIG. 14, an interlayer resin layer 180 as a second insulating layer is formed on the top face of the substrate 110, while an interlayer resin layer 190 as the second insulating layer is similarly formed on the bottom face. These insulating resin layers 180 and 190 may be formed by, for example, having a polyamide-type resin or an epoxy-type film-laminated or having these paste printed.

Figure 15:
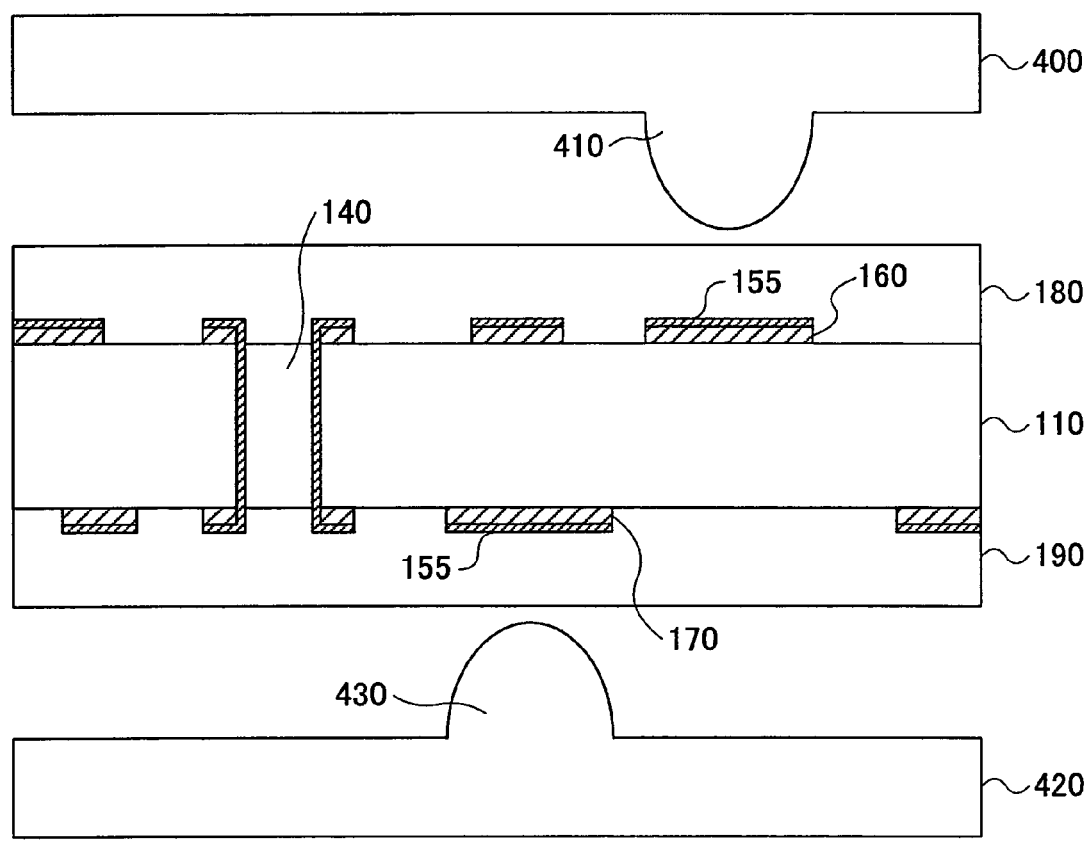
FIG. 15 is a cross-sectional view of a sixth manufacturing process of the wiring board according to the present embodiments.

FIG. 15 is a cross-sectional view of a sixth manufacturing process of a wiring board according to the present embodiment. In the sixth manufacturing process as illustrated in FIG. 15, a die 400 is arranged over the top face of the insulating resin layer 180, and a die 420 is similarly arranged over the bottom face of the insulating resin layer 190. On one face of the die 400, a semispherical-shaped projecting section (below referred to as "the semispherical-shaped projecting section") 410 is formed, and is arranged so that the face having formed thereon this semispherical-shaped projecting section 410 opposes the interlayer resin layer 180, and, the semispherical-shaped insulating section 410 is positioned above the via-forming wiring patterns 160 and 155. Similarly, on one face of the die 420, a semispherical-shaped projecting section 430 is formed, and is arranged so that the face having formed thereon this semispherical-shaped projecting section 430 opposes the interlayer resin layer 190, and the semispherical-shaped projecting section 430 is positioned above the via-forming wiring patterns 170 and 155.

Figure 16:
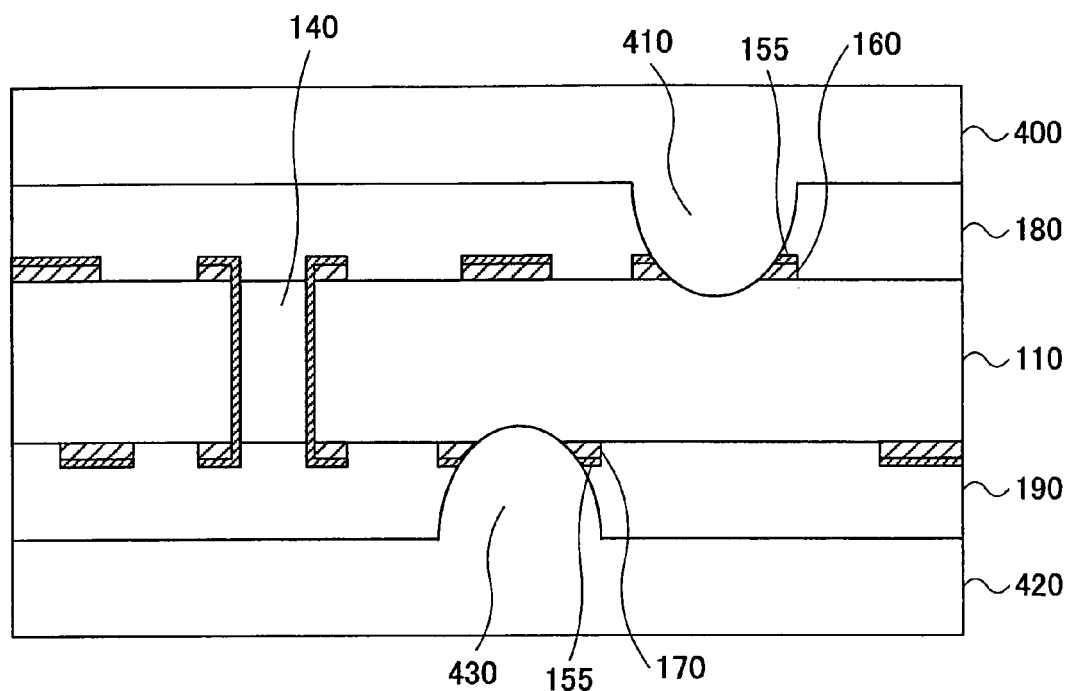
FIG. 16 is a cross-sectional view of a seventh manufacturing process of the wiring board according to the present embodiments.

FIG. 16 is a cross-sectional view of a seventh manufacturing process of a wiring board according to the present embodiment. In the seventh manufacturing process as illustrated in FIG. 16, a press process is performed with dies 400 and 420 so that the insulating resin layer 180 is thrust by the die 400, while the insulating resin layer 190 is thrust by the die 420.

Figure 17:
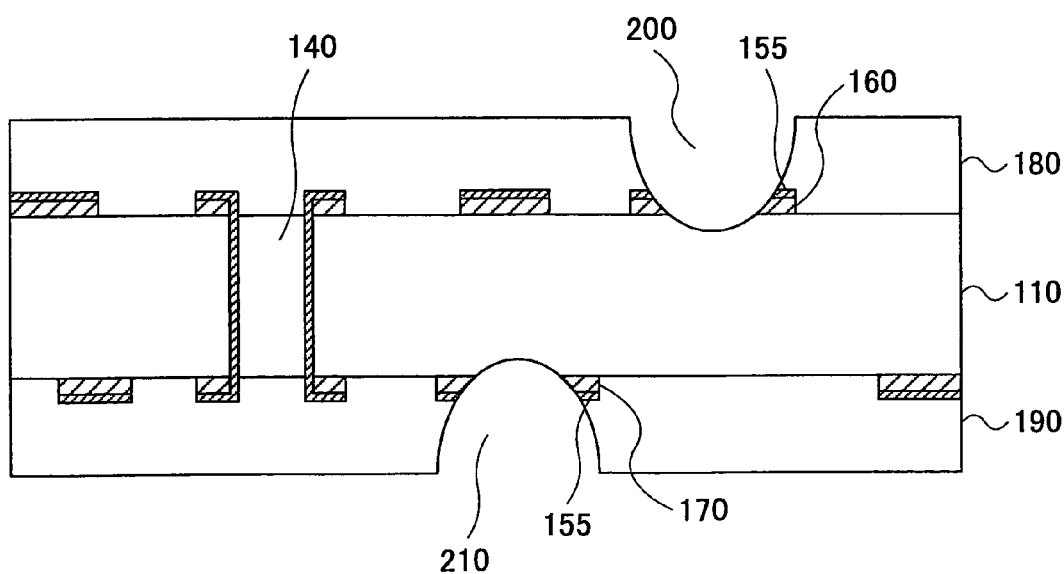
FIG. 17 is a cross-sectional view of an eighth manufacturing process of the wiring board according to the present embodiments.

FIG. 17 is a cross-sectional view of an eighth manufacturing process of a wiring board according to the present embodiment. In the eighth manufacturing process as illustrated in FIG. 17, a semispherical-shaped opening section (below referred to as "the semispherical-shaped opening section") 200 is formed at a via-forming region in the interlayer resin layer 180 by a thrusting of the die 400. Similarly, a semispherical-shaped opening section 210 is formed at a via-forming region in the interlayer resin layer 190 by a thrusting of the die 420.

Figure 18:
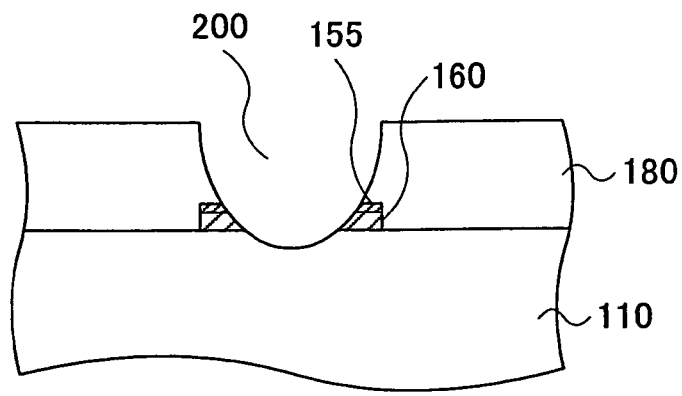
FIG. 18 is an enlarged cross-sectional view in the vicinity of a semispherical-shaped opening section according to the present embodiments.
Figure 19:
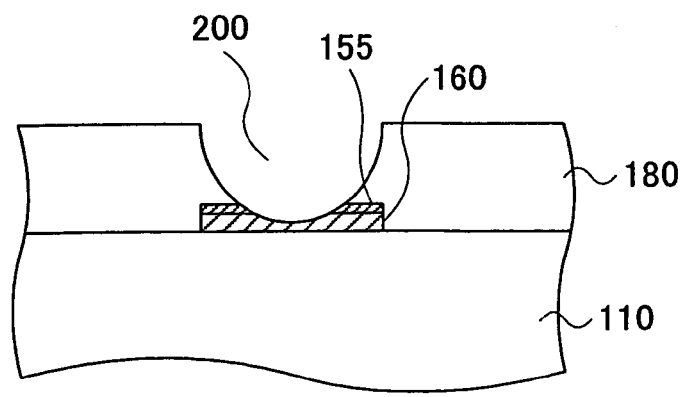
FIG. 19 is another example of the enlarged cross-sectional view in the vicinity of the semispherical-shaped opening section according to the present embodiments.

Here the depth of the semispherical-shaped opening section 200 which is formed in the interlayer resin layer 180 may be such that a portion of each of the via-forming wiring patterns 160 and 155 is exposed. For example, as illustrated in FIG. 18, the semispherical-shaped opening section 200 may be formed so as to penetrate not only the interlayer resin layer 180, but also the via-forming wiring patterns 160 and 155. In this case, in the semispherical-shaped opening section 200, cross-sectional areas of the via-forming wiring patterns 160 and 155 as well as the substrate 110 are exposed. Alternatively, as illustrated in FIG. 19, the semispherical-shaped opening section 200 may be formed so as to penetrate only the interlayer resin layer 180 and the wiring patterns so that only the top-face portions of the via-forming wiring patterns 160 and 155 are removed. In this case, the top-face areas of the via-forming wiring patterns 160 and 155 are exposed in the semispherical-shaped opening section 200. The same holds for the semispherical-shaped opening section 210 which is formed in the interlayer resin layer 190 so that the depth of the semispherical-shaped opening section 210 may be such that a portion of each of the via-forming wiring patterns 170 and 155 is exposed.

Figure 20:
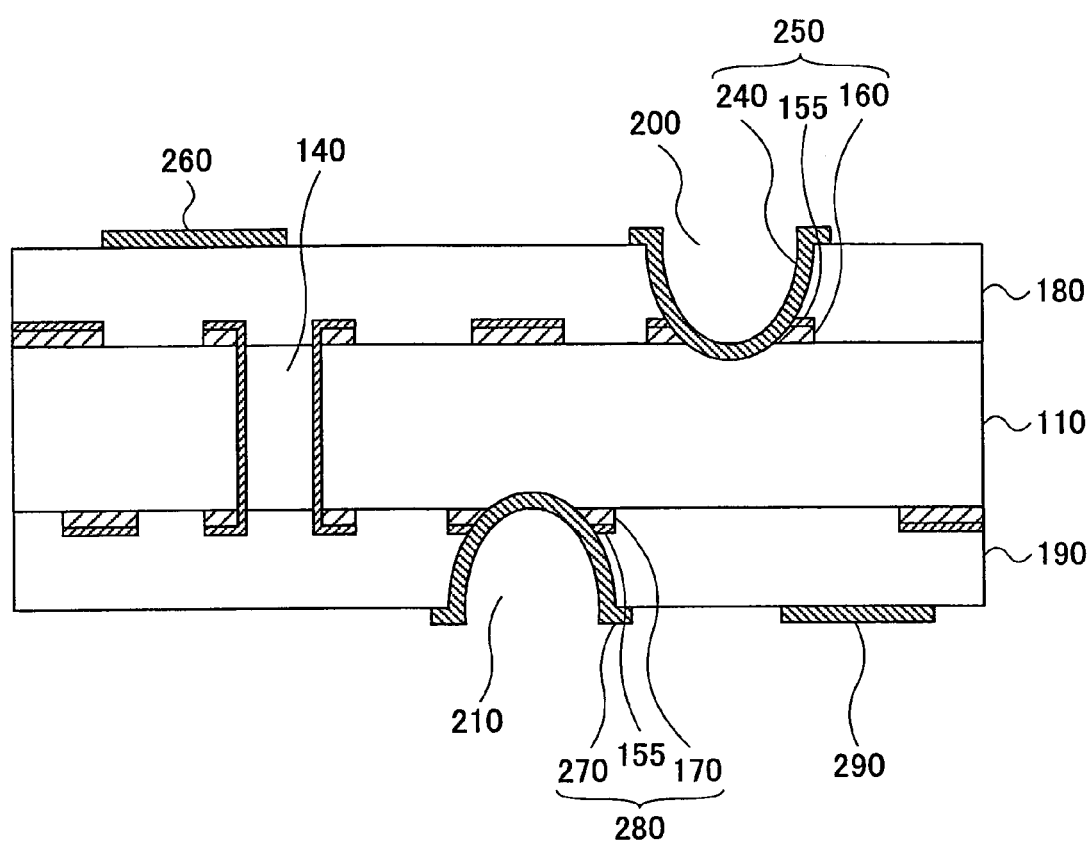
FIG. 20 is a cross-sectional view of a ninth manufacturing process of the wiring board according to the present embodiments.

FIG. 20 is a cross-sectional view of a ninth manufacturing process of a wiring board according to the present embodiment. In the ninth manufacturing process as illustrated in FIG. 20, a conducting film 240 is formed on an inner-wall face of the semispherical-shaped opening section 200. This conducting film 240 is formed, for example, after a metal thin-film (no figures) is formed on the inner-wall face of the semispherical-shaped opening section 200 by such electro-less plating as copper plating and the like, by having further electroplating performed with this metal thin-film as a feeding layer. As described above, in the semispherical-shaped opening section 200, a portion of each of the via-forming wiring patterns 160 and 155 is exposed. Therefore, the conducting film 240 which is formed on the inner-wall face of the semispherical-shaped opening section 200, and the via-forming wiring patterns 160 and 155 are electrically connected so as to configure a via 250. Moreover, in the ninth manufacturing process, a conducting film 270 is similarly formed on an inner-wall face of the semispherical-shaped opening section 210. In the semispherical-shaped opening section 210, a portion of each of the via-forming wiring patterns 170 and 155 is exposed. Therefore, the conducting film 270 which is formed on the inner-wall face of the semispherical-shaped opening section 210, and the via-forming wiring patterns 170 and 155 are electrically connected so as to configure a via 280. According to such manufacturing processes, the wiring boards are manufactured.

Furthermore, while a case in which the semispherical-shaped opening section 210 is formed is described, a conical-shaped opening section having a shape of a circular cone or a triangular pyramid may be formed. Below, a case in which a conical-shaped opening section is formed is described. Furthermore, the case in which the conical-shaped opening section is formed, for the first through the fifth manufacturing processes which are illustrated in FIG. 10 through FIG. 14, is similar to the case in which the semispherical-shaped opening section 210 is formed.

Figure 21:
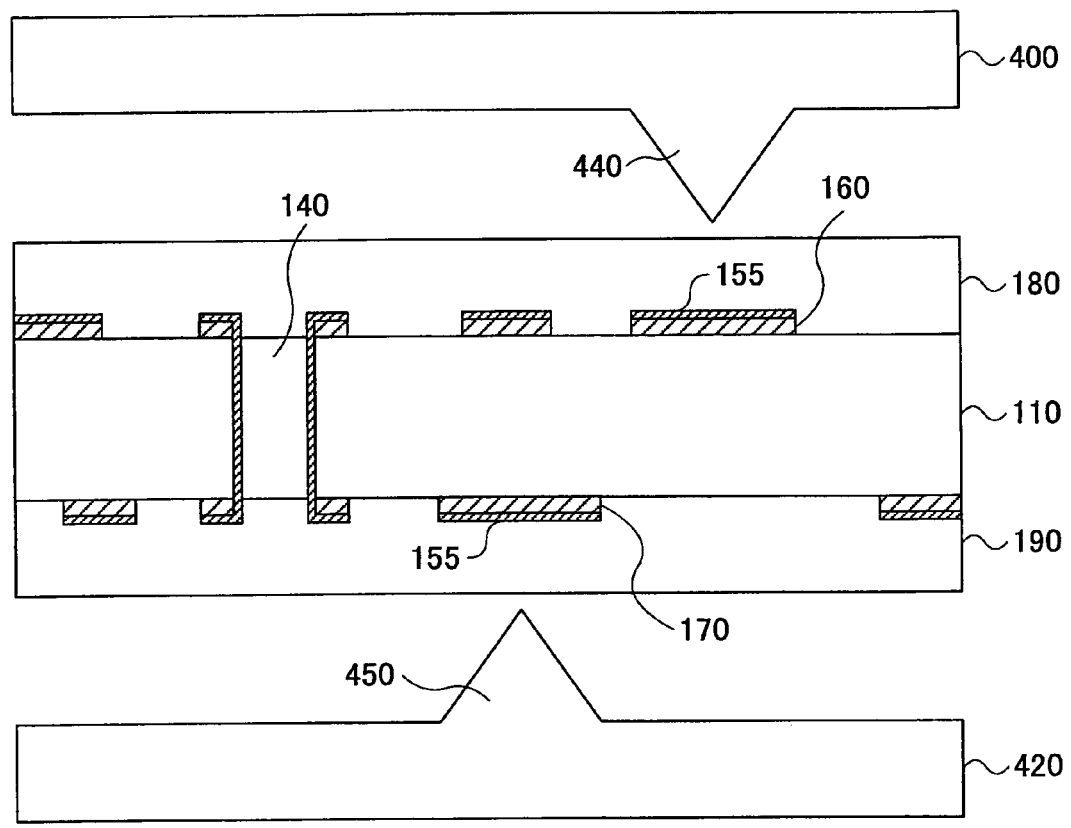
FIG. 21 is a cross-sectional view of another example of the sixth manufacturing process of the wiring board according to the present embodiments.

FIG. 21 is a cross-sectional view of another example of the sixth manufacturing process of a wiring board according to the present embodiment. In the sixth manufacturing process as illustrated in FIG. 21, a die 400 having formed a conical-shaped convex section (below referred to as "the conical-shaped convex section") 440 is positioned above the top face of the interlayer resin layer 180, and similarly a die 420 having formed a conical-shaped convex section 450 is positioned above the bottom face of the interlayer resin layer 190. The die 400 is arranged so that the face on which the conical-shaped convex section 440 is formed opposes the interlayer resin layer 180, and the conical-shaped convex section 440 is positioned above the via-forming wiring patterns 160 and 155. Similarly, the die 420 is arranged so that the face on which the conical-shaped convex section 450 is formed opposes the interlayer resin layer 190, and the conical-shaped convex section 450 is positioned above the via-forming wiring patterns 170 and 155.

Figure 22:
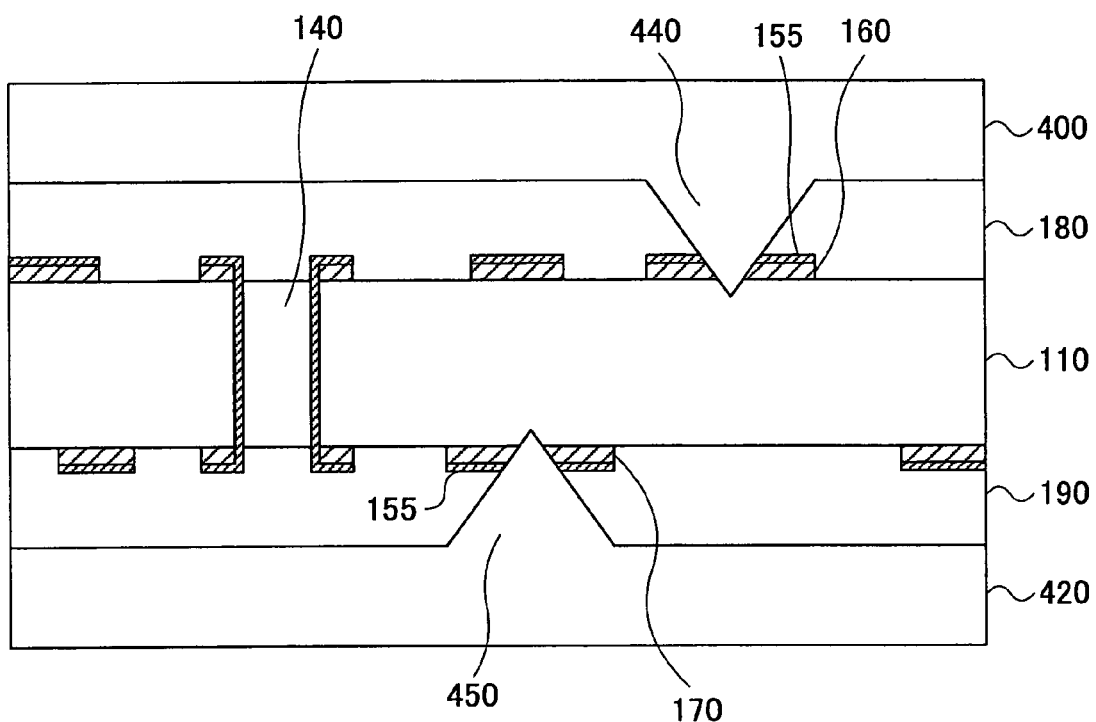
FIG. 22 is a cross-sectional view of another example of the seventh manufacturing process of the wiring board according to the present embodiments.

FIG. 22 is a cross-sectional view of another example of the seventh manufacturing process of a wiring board according to the present embodiment. In the seventh manufacturing process as illustrated in FIG. 22, the interlayer resin layer 180 is thrust by the die 400, while the interlayer resin layer 190 is thrust by the die 420.

Figure 23:
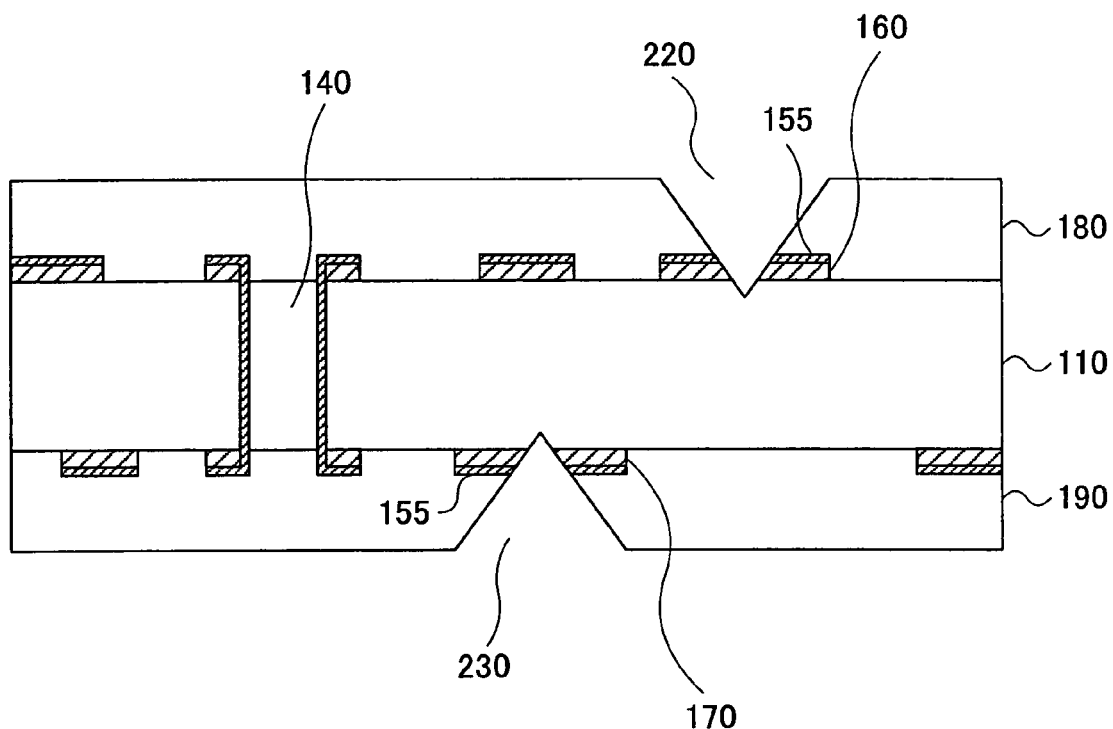
FIG. 23 is a cross-sectional view of another example of the eighth manufacturing process of the wiring board according to the present embodiments.

FIG. 23 is a cross-sectional view of another example of the eighth manufacturing process of a wiring board according to the present embodiment. In the eighth manufacturing process as illustrated in FIG. 23, a conical-shaped opening section (below referred to as "the conical-shaped opening section") 220 is formed at a via-forming region in the interlayer resin layer 180 by a thrusting of the die 400.

Similarly, a conical-shaped opening section 230 is formed at a via-forming region in the interlayer resin layer 190 by a thrusting of the die 420.

Figure 24:
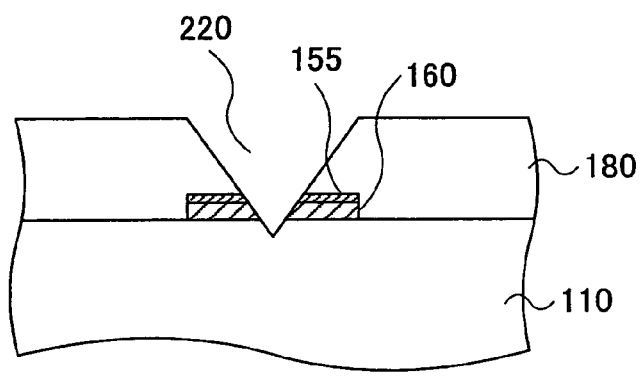
FIG. 24 is an enlarged cross-sectional view in the vicinity of a conical-shaped opening section according to the present embodiments.
Figure 25:
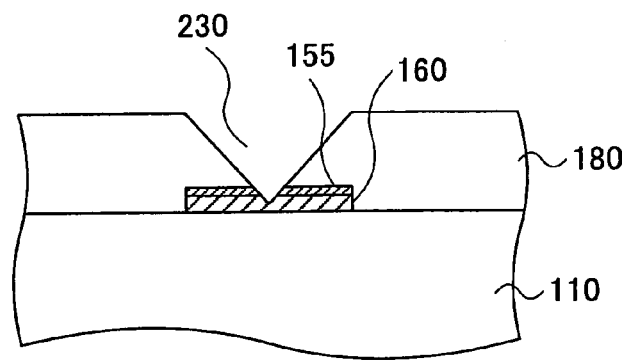
FIG. 25 is an enlarged cross-sectional view of another example in the vicinity of the conical-shaped opening section according to the present embodiments.

Here the depth of the conical-shaped opening section 230 which is formed in the interlayer resin layer 180, as with the semispherical-shaped opening section 200 as described above, may be such that a portion of each of the via-forming wiring patterns 160 and 155 is exposed. For example, as illustrated in FIG. 24, the conical-shaped opening section 220 may be formed so as to penetrate not only the interlayer resin layer 180, but also the via-forming wiring patterns 160 and 155. Alternatively, as illustrated in FIG. 25, the conical-shaped opening section 220 may be formed so as to penetrate only the interlayer resin layer 180 so that only the top-face portion of each of the via-forming wiring patterns 160 and 155 is removed. The same holds for the conical-shaped opening section 230 which is formed in the interlayer resin layer 190 so that the depth of the conical-shaped opening section 230 may be such that a portion of each of the via-forming wiring patterns 170 and 155 is exposed.

Figure 26:
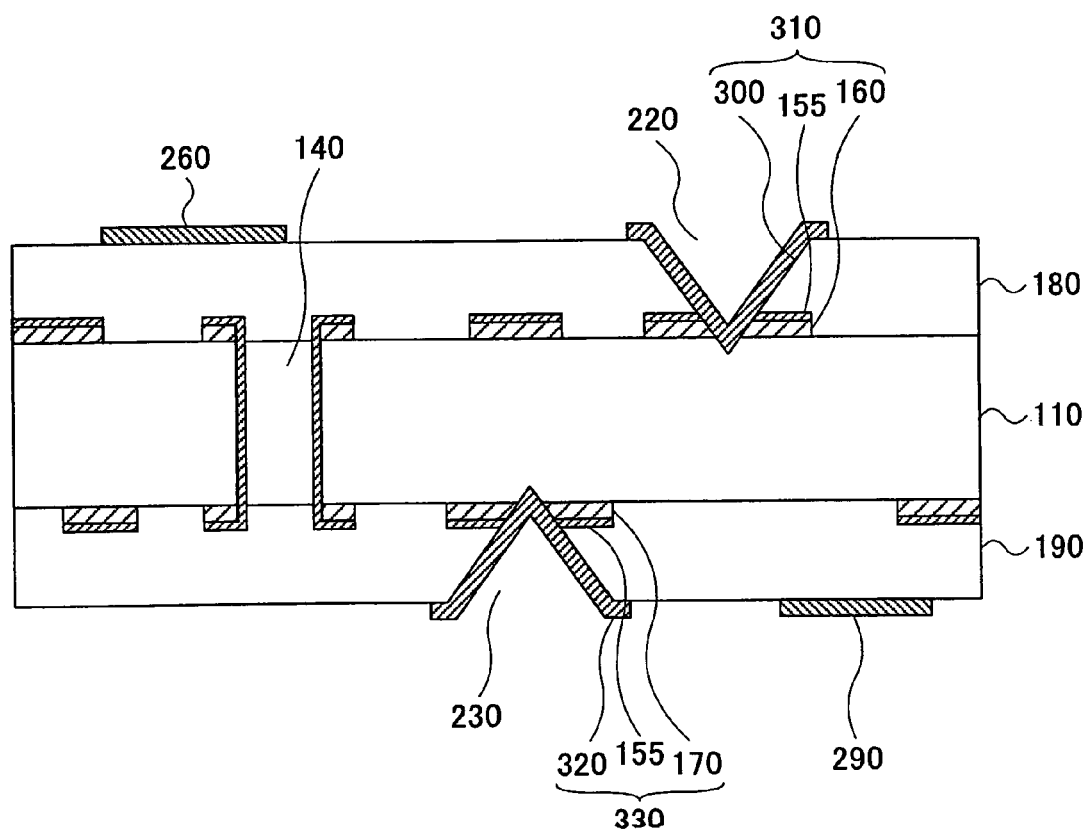
FIG. 26 is a cross-sectional view of another example of the ninth manufacturing process of the wiring board according to the present embodiments.

FIG. 26 is a cross-sectional view of the ninth manufacturing process of the wiring board according to the present embodiment. In the ninth manufacturing process as illustrated in FIG. 26, a conducting film 300 is formed on an inner-wall face of the conical-shaped opening section 220. As described above, in the conical-shaped opening section 220, a portion of each of the via-forming wiring patterns 160 and 155 is exposed. Therefore, the conducting film 300 which is formed on the inner-wall face of the conical-shaped opening section 220, and the via-forming wiring patterns 160 and 155 are electrically connected so as to configure a via 310. Moreover, in the ninth manufacturing process, a conducting film 320 is similarly formed on an inner-wall face of the conical-shaped opening section 230. In the conical-shaped opening section 230, as a portion of each of the via-forming wiring patterns 170 and 155 is exposed, the conducting film 320 and the via-forming wiring patterns 170 and 155 are electrically connected so as to configure a via 330. According to such manufacturing processes, the wiring boards are manufactured.

Thus, in the present embodiments, a press process is adopted in which, when the opening sections 200 and 210 which cause the portions of the wiring patterns 160, 170, and 155 to be exposed are formed, the dies 400 and 420 having the semispherical-shaped convex sections 410 and 430 are thrust into the interlayer resin layer 180 and 190, respectively. Similarly, a press process is adopted in which, when the opening sections 220 and 230 which cause the portions of the wiring patterns 160, 170, and 155 to be exposed are formed, the dies 400 and 420 having the conical-shaped convex sections 440 and 450 are thrust into the interlayer resin layer 180 and 190, respectively. In other words, as convex-section tips which the dies 400 and 420 have are not flat, the interlayer resin layer 180 and the like are likely to be displaced from the top portion of the wiring pattern 160 and the like when the opening section 200 and the like are formed by the thrusting of the dies 400 and 420. Therefore, a portion of the interlayer resin layer 180 remaining at the bottom portion of the opening section 200 is prevented. Therefore, a process of removing the remaining insulating layer is made unnecessary, enabling a simplifying of the process.

Furthermore, while the wiring patterns 155, 160, 170, interlayer resin layers 180, 190, opening sections 200, 210, etc., are formed at both the top and the bottom faces of the substrate 110, these may be formed at only one of the faces.

Figure 27:
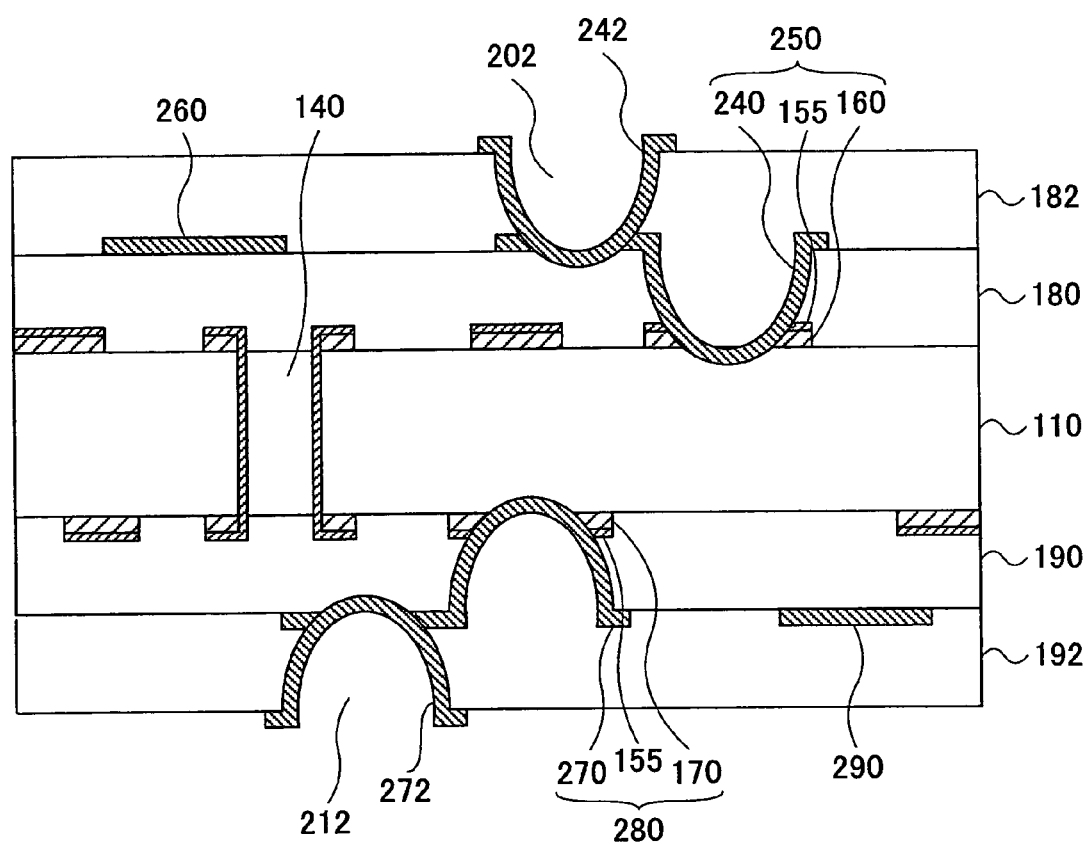
FIG. 27 is a cross-sectional view of a manufacturing process of a wiring board further having interlayer resin layers laminated according to the present embodiments.

Moreover, the present invention may also be applied to a case of manufacturing a wiring board having further interlayer resin layers laminated. In this case, in the ninth manufacturing process as illustrated in FIG. 20, after the conducting film 240 and the like are formed on the inner-wall face of the opening section 200 and like, the fifth manufacturing process as illustrated in FIG. 14 through the ninth manufacturing process as illustrated in FIG. 20 may be caused to be repeated. In other words, as illustrated in FIG. 27, an interlayer resin layer 182 is further formed on the top face of an interlayer resin layer 180, while an interlayer resin layer 192 is further formed on the bottom face of an interlayer resin layer 190. Furthermore, by a thrusting of a die having a semispherical-shaped convex section, at a via-forming region in the interlayer resin layer 182, a semispherical-shaped opening section 202 is formed so that a portion of a conducting film 240 is exposed, and similarly at a via-forming region in the interlayer resin layer 192, a semispherical-shaped opening section 212 is formed so that a portion of a conducting film 270 is exposed. Furthermore, on an inner-wall face of a semispherical-shaped opening section 202, a conducting film 242 which is electrically connected to the conducting film 240 is formed. Similarly, on an inner-wall face of a semispherical-shaped opening section 212, a conducting film 272 which is electrically connected to the conducting film 270 is formed. Furthermore, in a case in which a conical-shaped opening section is formed, manufacturing a wiring board having further interlayer resin layers laminated is enabled by a similar manufacturing process.

The present application is based on Japanese Priority Patent Application No. 2003-187855 filed Jun. 30, 2003, with the Japanese Patent Office, the entire contents of which are hereby incorporated by reference.

What is claimed is:

1. A method of manufacturing a wiring board, comprising the steps of:
   forming a conductor on a surface of a first insulating layer;
   forming a second insulating layer on surfaces of the first insulating layer and the conductor; and
   forming, by a press process which thrusts into said second insulating layer a die with its tip portion having one of a semispherical-shaped and a conical-shaped convex section, in said second insulating layer, a corresponding semispherical-shaped or conical-shaped opening section which causes a portion of said conductor to be exposed.

2. The method of manufacturing a wiring board as claimed in claim 1, wherein the step of forming, in said second insulating layer, the semispherical-shaped or the conical-shaped opening section which causes the portion of said conductor to be exposed, further causes a portion of said first insulating layer to be exposed.

3. The method of manufacturing a wiring board as claimed in claim 1, further comprising the step of:
   forming a conducting film on an inner-wall face of said opening section.

* * * * *